United States Patent [19]

Watanabe

[11] Patent Number: 4,583,205
[45] Date of Patent: Apr. 15, 1986

[54] PROGRAMMABLE MEMORY CIRCUIT WITH AN IMPROVED PROGRAMMING VOLTAGE APPLYING CIRCUIT

[75] Inventor: Takeshi Watanabe, Tokyo, Japan
[73] Assignee: NEC Corporation, Tokyo, Japan
[21] Appl. No.: 532,923
[22] Filed: Sep. 16, 1983

[30] Foreign Application Priority Data

Sep. 17, 1982 [JP] Japan .................. 57-161861

[51] Int. Cl.$^4$ .............. G11C 7/00; G11C 8/00
[52] U.S. Cl. .................... 365/189; 307/449; 307/463; 365/230; 365/184
[58] Field of Search ............... 365/230, 184, 185, 189; 357/23.5; 307/449, 463, 468, 469

[56] References Cited

U.S. PATENT DOCUMENTS

| | | | |
|---|---|---|---|
| 4,094,012 | 6/1978 | Perlegos et al. | 365/230 |
| 4,264,828 | 4/1981 | Perlegos et al. | 365/230 |
| 4,404,659 | 9/1983 | Kihara et al. | 365/185 |
| 4,455,629 | 12/1984 | Suzuki et al. | 365/230 |

FOREIGN PATENT DOCUMENTS

| | | |
|---|---|---|
| 0019381 | 11/1980 | European Pat. Off. . |
| 0055906 | 7/1982 | European Pat. Off. . |
| 0152933 | 1/1979 | Japan .................. 365/189 |
| 0100686 | 6/1982 | Japan . |

OTHER PUBLICATIONS

Stewart et al., "A 40ns CMOS E$^2$PROM", IEEE ISSCC Digest of Tech. Papers, Feb. 11, 1982, pp. 110–111, 303.

Primary Examiner—Stuart N. Hecker
Assistant Examiner—Glenn A. Gossage
Attorney, Agent, or Firm—Sughrue, Mion, Zinn, Macpeak, and Seas

[57] ABSTRACT

A programmable memory circuit adapted to access a memory comprises a decoder responsive to address input signals, an access line, a transfer gate connected between the decoder and the access line, and a selective voltage supply circuit connected to the access line. The transfer gate is responsive to a read/write switch signal to connect the decoder to the access line in the read mode and disconnect the decoder from the access line in the write mode. The selective voltage supply circuit is also responsive to the read/write switch signal to provide on the access line different voltage levels in accordance with read/write mode. The access line assumes, in the read mode, one voltage level which is equal to the level of the output signal from the decoder and in the write mode the other voltage level.

4 Claims, 3 Drawing Figures

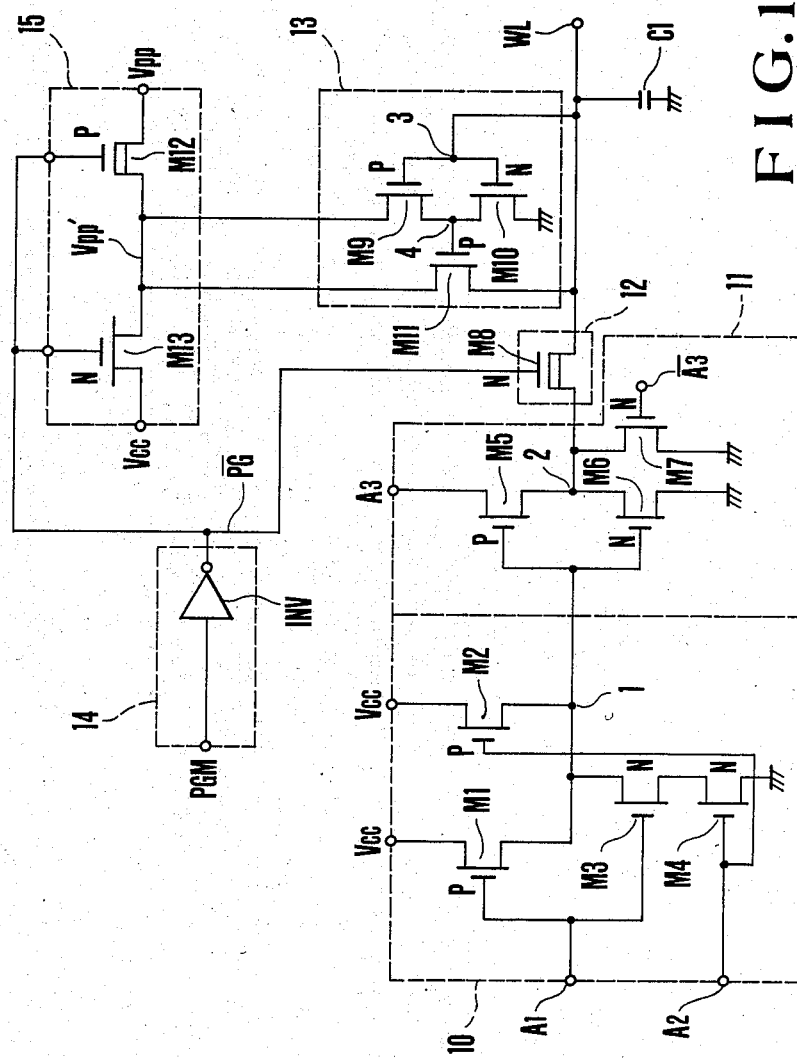
F I G. 1

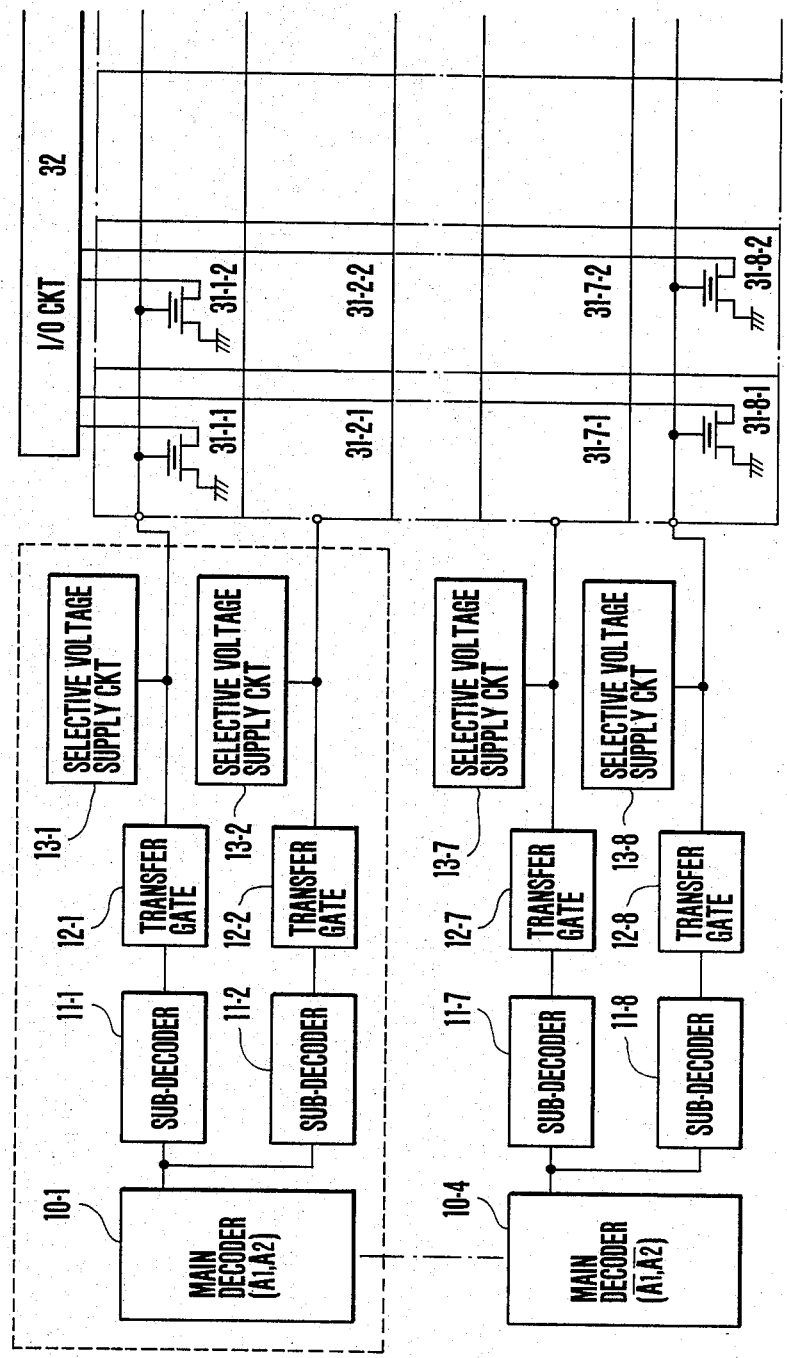
F I G. 3

PROGRAMMABLE MEMORY CIRCUIT WITH AN IMPROVED PROGRAMMING VOLTAGE APPLYING CIRCUIT

BACKGROUND OF THE INVENTION

The present invention relates to a programmable memory circuit and, more particularly, to a complementary type programmable memory circuit which accesses selected one of a plurality of non-volatile semiconductor memory cells.

Since read and write voltages for the programmable memory have different levels, it is necessary to provide a circuit which can deal with voltages of two levels and control the supply of the two-level voltages to the memory. Conventionally, such a circuit is very complicated.

In order to decrease power consumption, it has been proposed to use complementary insulated gate field effect transistors (CMOSFETs) for a circuit adapted to access non-volatile semiconductor memory cells. However, many insulated gate field effect transistors (hereinafter referred to as IGFETs) must be used to constitute a multi-input circuit such as a decoder of the complementary IGFET type, and this circuit is not suited for high speed operations.

SUMMARY OF THE INVENTION

It is, therefore, an object of the present invention to provide a novel complementary type programmable memory circuit which can be constituted by a small number of IGFETs to ensure highly integrated structure.

According to the present invention, a programmable memory circuit comprises a decoder responsive to address input signals for accessing the memory, an access line for the memory, a transfer gate connected between the decoder and the access line, and a selective voltage supply circuit connected to the access line. The transfer gate is responsive to a read/write switch signal to connect the decoder to the access line in the read mode and disconnect the decoder from the access line in the write mode. The selective voltage supply circuit is also responsive to the read/write switch signal to provide on the access line different voltage levels in accordance with read/write mode. The access line assumes, in the read mode, one voltage level which is equal to the level of the output signal from the decoder and in the write mode the other voltage level.

BRIEF DESCRIPTION OF THE DRAWINGS

FIG. 1 is a circuit diagram illustrating a programmable memory circuit according to an embodiment of the present invention;

FIG. 3 is a block diagram showing a set of the programmable memory circuit of the present invention applied to a PROM.

DETAILED DESCRIPTION OF PREFERRED EMBODIMENT

Figure 2:
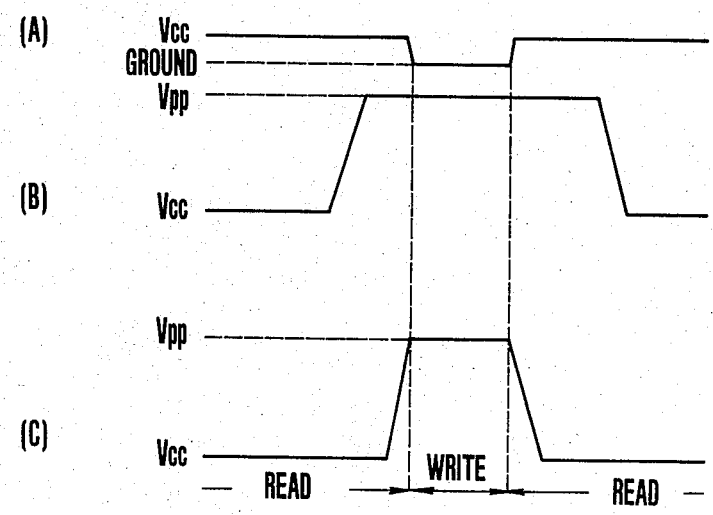
FIG. 2 is a waveform diagram useful in explaining read and write operations.

FIG. 1 shows a 3-input complementary type programmable memory circuit according to an embodiment of the present invention. A 2-input NAND gate includes P-channel IGFETs M1 and M2 and N-channel IGFETs M3 and M4. Two address input signals A1 and A2 are supplied to the 2-input NAND gate. An output terminal 1 of the 2-input NAND gate is set to be logic "0" (corresponding to the ground potential) only when both the address input signals A1 and A2 are set to be logic "1" (corresponding to a read power supply voltage Vcc of +5 V for non-volatile semiconductor memory cells). Otherwise, the output terminal 1 of the NAND gate is set to be logic "1". Thus, the 2-input NAND gate constitutes a main decoder 10.

A complementary logic circuit comprises a P-channel IGFET M5 and an N-channel IGFET M6 and receives the output logic signal from the output terminal 1. The source of the IGFET M6 is grounded, while the source of the IGFET M5 receives an address input signal A3. The drains of the IGFETs M5 and M6 are connected to each other. An output from the complementary logic circuit appears at the common node (output terminal 2) of the drains of the IGFETs M5 and M6. The drain of an N-channel IGFET M7 is connected to the output terminal 2, the gate thereof receives an address signal $\overline{A3}$ which is an inverted signal of the address signal A3, and the source thereof is grounded. The complementay logic circuit and the IGFET M7 constitutes a sub-decoder 11, and a 3-input decoder is constituted by the main decoder 10 and the sub-decoder 11.

An N-channel depletion-type IGFET M8 is connected between the output terminal 2 of the complementary logic circuit, that is, the decoder and a word line WL. The gate of the IGFET M8 is controlled by a read/write switch signal $\overline{PG}$. Thus, the depletion-type IGFET M8 constitutes a transfer gate means 12.

A complementary inverter circuit has a P-channel IGFET M9 and an N-channel IGFET M10 which are connected between a power supply voltage Vpp' (high in the write mode and low in the read mode) and the ground. A P-channel IGFET M11 is further arranged to receive an output from an output terminal 4 of the complementary inverter circuit. The source of the IGFET M11 is connected to the power supply voltage Vpp' and the drain thereof is connected to the word line WL. The complementary inverter circuit having its input terminal 3 connected to the word line WL and the IGFET M11 constitute a selective voltage supply circuit 13. A load capacitor C1 is connected between the word line WL and ground.

The power supply voltage Vpp' is fed from a drive circuit 15 so as to bear, in accordance with the logic of the read/write switch signal $\overline{PG}$, one of two levels Vcc and Vpp respectively corresponding to read power supply voltage of +5 V and write power supply voltage of +25 V for the non-volatile semiconductor memory cells. The drive circuit 15 comprises a P-channel depletion type IGFET M12 and an N-channel IGFET M13. The source of the IGFET M12 receives the write power supply voltage Vpp and the source of the IGFET M13 receives the read power supply voltage Vcc. The drains of the IGFETs M12 and M13, on which the power supply voltage Vpp' appears, are connected in common and coupled to the sources of the IGFETs M9 and M11 included in the selective voltage supply circuit 13. The gates of the IGFETs M12 and M13 are connected in common to receive the read/write switch signal $\overline{PG}$ which is fed from a $\overline{PG}$ signal generator 14. An external signal PGM which is "0" during the read cycle and "1" during the write cycle is inverted by an inverter INV included in the $\overline{PG}$ signal generator 14 so that the read/write switch signal $\overline{PG}$ which assumes "1" of Vcc level in the read mode and "0" of ground level in the write mode as shown at section (A) in FIG. 2 is produced from the $\overline{PG}$ signal generator 14. A read/write signal as shown at section (B) in FIG. 2 is generated from a circuit not shown, alternately bearing Vcc and Vpp and it is selectively applied to the source of the IGFET M13 or M12.

OPERATION

I. In case where the output terminal 1 assumes "1"

Now assume that one of the address input signals A1 and A2 is set to be at logic "0" so that the potential at the output terminal 1 is set to be logic "1". The P-channel IGFET M5 is turned off and the N-channel IGFET M6 is turned on. Therefore, potential at the output terminal 2 is kept at logic "0" irrespective of the logic state of the address input signal A3.

In the read mode, the read/write switch signal $\overline{PG}$ is set to be logic "1", assuming a potential corresponding to the read power supply voltage Vcc. Accordingly, in the drive circuit 15, the N-channel IGFET M13 is turned on and the P-channel depletion type IGFET M12 is turned off to cause the power supply voltage Vpp' to assume the read power supply voltage Vcc as shown at section (c) in FIG. 2. In addition, the depletion-type IGFET M8 is kept on in the read mode, and the word line WL is set to be at the same potential as that at the output terminal 2, i.e., the ground potential.

When the word line WL is set to be "0", the IGFET M9 is turned on and the IGFET M10 is turned off. As a result, the potential at the output terminal 4 is set to be "1". The IGFET M11 is then turned off, so that the transfer of the power supply voltage Vpp' now being the read power supply voltage Vcc to the word line WL is interrupted.

Time required for changing the logic state of the word line WL from "1" to "0" is determined by a conductance gm of the IGFETs M6 and M8 and the capacitance of the capacitor C1.

In the write mode, the read/write switch signal $\overline{PG}$ is set to be "0". In the drive circuit 15, the P-channel depletion type IGFET M12 is turned on and the N-channel IGFET M13 is turned off to cause the power supply voltage Vpp' to assume the write power supply voltage Vpp as shown at section (c) in FIG. 2. The N-channel depletion-type IGFET M8 is kept on when the potential at the output terminal 2 is "0", and the potential at the word line WL becomes the same as that at the output terminal 2, i.e., the ground potential.

II. In case where the output terminal 1 assumes "0"

As previously described, only when both the address input signals A1 and A2 are set to be "1", the potential at the output terminal 1 is set to be "0". The P-channel IGFET M5 is turned on and the N-channel IGFET M6 is turned off. Thus, the potential at the word line WL is determined by the logic state of the address input signal A3. When the address input signal A3 is set to be "1", the N-channel IGFET M7 receiving the inversion A3 is turned off. The potential at the output terminal 2 is the same as that of the address input signal A3. In other words, the potential at the output terminal 2 is set to be logic "1" (i.e., the read power supply voltage Vcc).

In the read mode, since the read/write switch signal $\overline{PG}$ is set to be "1", the IGFET M8 is turned on and the word line WL is set to "1" of the same potential as at the output terminal 2 and which corresponds to the read power supply voltage Vcc. On the other hand, when the word line WL is "1", the P-channel IGFET M9 is turned off, the N-channel IGFET M10 is turned on, and the IGFET M11 is turned on. Since, in the drive circuit 15, the IGFETs M13 and M12 respond to the read/write switch signal $\overline{PG}$ now being "1" and only the IGFET M13 is turned on, the read supply voltage Vcc appearing at the source of the IGFET M13 is transmitted to the word line WL through the IGFET M11. Thus, the logic state of the word line determined by the potential appearing at the output terminal 2 is not disturbed. In this manner, the level of logic "1" of the word line WL in the read mode can be Vcc level or +5 V which is suitable for reading non-volatile semiconductor memory cells. Time required for changing the logic state of the word line WL from "0" to "1" is determined by a conductance gm of the IGFETs M5 and M8 and the capacitance of the capacitor C1.

In the write mode, since the read/write switch signal $\overline{PG}$ goes to logic "0", a voltage of +5 V (Vcc) is applied to the source of the IGFET M8, and a voltage of 0 V is applied to the gate thereof. The IGFET M8 is then turned off. More particularly, when the IGFET M5 is turned on and the potential at the output terminal 2 becomes the read power supply voltage Vcc of +5 V, the potential at the word line WL is increased through the IGFET M8 until the IGFET M8 is turned off. In this case, the potential at the word line WL corresponds to an absolute value of the threshold voltage $V_T$ of the IGFET M8. Consequently, the IGFET M10 is turned on to decrease the potential at the output terminal 3. The IGFET M11 is then turned on, so that the word line WL is applied with the power supply voltage Vpp' which now corresponds to the write power supply voltage Vpp since, in the drive circuit, the P-channel IGFET M12 is turned on in response to the logic "0" of the read/write switch signal $\overline{PG}$, with the N-channel IGFET M13 rendered off, and the write power supply voltage Vpp is passed. In this case, the IGFET M8 is kept off, and the word line WL is separated or disconnected from the decoder 11 having the IGFETs M1 to M7. As a result, in the write mode, the word line WL becomes "1" of a level equal to the write power supply voltage Vpp of +25 V.

It should be noted that a threshold voltage $V_T$ of the depletion-type IGFET M8 must be less than −5 V to turn off the IGFET M8 when a voltage of +5 V is applied to the source thereof and a voltage of 0 V is applied to the gate thereof.

With the output terminal 1 set at "0", when the address input signal A3 is set to "0", the IGFET M7 is turned on, and then the output terminal 2 is set to be logic "0". As a result, the word line WL is set to be logic "0".

Charge/discharge time in the read mode is determined by the conductance gm of the IGFETs M5 and M8 and the IGFETs M6 and M8. In this embodiment, since the IGFET M8 is of depletion type, and its gate voltage is set at the read power supply voltage Vcc, the conductance gm of the IGFET M8 is high. For this reason, the charge/discharge time is short, and high-speed operation can be performed.

In the write mode, the decoder can be separated or disconnected from the word line WL by the IGFET M8, so that the decoder circuit can be prevented from being exposed to the write voltage and can be easily disconnected from the write circuit. Therefore, high-speed operation can be performed by a circuit having IGFETs each having a minimum channel length and a low breakdown voltage.

As described previously, the logic at the output terminal 1 of the main decoder 10 can be divided into two logics by the address input signals A3 and $\overline{A3}$ applied to the sub-decoder 11. When applying the programmable memory circuit to non-volatile semiconductor memory cells, first and second sub-decoders 11-1 and 11-2 are connected to one main decoder 10-1 to provide two channels of memory access circuit which branch from the output terminal 1 of the one main decoder as shown at a dotted line block in FIG. 3. The second sub-decoder 11-2 receives address input signals which are complementary to those applied to the first sub-decoder 11-1. In other words, when it is assumed that the sub-decoder 11 shown in FIG. 1 stands for the first sub-decoder 11-1, the second sub-decoder 11-2 has a P-channel IGFET M5 whose source receives an inverted address input signal $\overline{A3}$ and an N-channel IGFET M7 whose gate receives an address input signal A3. Advantageously, the two channels of memory access circuit branching from the one main decoder can reduce the number of main decoders to half the number of access lines for the memory cells. Accordingly, the number of IGFETs used to arrange the programmable memory circuit can be decreased. In the foregoing embodiment, the output logic from the output terminal 1 is divided into two logics by address input signals A3 and $\overline{A3}$; however, it may be divided into four or eight logics. In proportion to the number of division, the reduction in the number of IGFETs used can be amplified.

Furthermore, in the programmable memory circuit of the above embodiment, power is not substantially steadily consumed. Therefore, the programmable memory circuit of the present invention is suitable for a low-power configuration.

In summary, according to the present invention, one multi-input circuit having a number of IGFETs is used for several access lines. Therefore, as the number of access lines is increased, the reduction in the number of required IGFETs is amplified as compared with the conventional decoder circuit. Furthermore, according to the present invention, since the depletion-type IGFET is used, high-speed read operation can be performed. In the write mode, since the word line is separated from the decoder, no voltage drop occurs. As a result, a sufficient write voltage can be obtained.

The present invention has the above-mentioned advantages and may be suitably applied in the design of a high-capacity memory.

In an application, a number of the programmable memory circuit of the present invention are connected to a PROM, for example, having non-volatile semiconductor memory cells as shown in FIG. 3. Where the main decoder is exemplified as 2-input NAND gate, four main decoders 10-1 to 10-4 are provided. The main decoder 10-1 is followed by a first channel of memory access circuit including sub-decoder 11-1, transfer gate means 12-1, and selective voltage supply circuit 13-1 and a second channel of memory access circuit including sub-decoder 11-2, transfer gate means 12-2, and selective voltage supply circuit 13-2. Similarly, the main decoder 10-4 is followed by a seventh channel of memory access circuit including sub-decoder 11-7, transfer gate means 12-7, and selective voltage supply circuit 13-7 and an eighth channel of memory access circuit including sub-decoder 11-8, transfer gate means 12-8, and selective voltage supply circuit 13-8. A PROM 30 has a number of memory cells arrannged in matrix. For simplicity of illustration, only row access lines connected to cellM 30 has a number of memory cells arrannged in matrix. For simplicity of illustration, only row access lines connected to cells 31-1-1, 31-1-2 . . . through 31-8-1, 31-8-2 . . . are shown in FIG. 3 but obviously, a decoding arrangement for column access lines can be constructd in a similar manner. First to eighth row access lines respectively leading from the first to eighth channels are connected to cells 31-1-1, 31-1-2 . . . through 31-8-1, 31-8-2 . . . , respectively. Each of the cells 31-1-1, 31-1-2 . . . through 31-8-1, 31-8-2 . . . has a non-volatile semiconductor element with a floating gate. A semiconductor element of each of the cells 31-1-1, 31-1-2 . . . has its gate connected to the first row access line, its source connected to an input/output circuit 32 and its drain grounded. Similarly, a semiconductor element of each of the cells 31-8-1, 31-8-2 . . . has its gate connected to the eighth row access line, its source connected to the input/output circuit 32 and its drain grounded.

In operation, the first to fourth main decoders 10-1 to 10-4 are applied with a set of address input signals A1, A2, a set of address input signals $\overline{A1}$, A2, a set of address input signals A1, $\overline{A2}$, and a set of address input signals $\overline{A1}$, $\overline{A2}$, and one of the two sub-decoders associated with one main decoder is applied with a set of address input signals A3, $\overline{A3}$ and its complementare two sub-decoders associated with one main decoder is applied with a set of address input signals A3, $\overline{A3}$ and its complementary is applied to the other sub-decoder. Obviously, in accordance with combinations of logic states of the address signals applied to the first to fourth main decoders and to the first to eighth sub-decoders, one of the access lines can be set to "1" with the remaining seven access lines set to "0". The access line set at "1" can have the Vcc level of +5 V in the read mode and the Vpp level of +25 V in the write mode.

What is claimed is:

1. A programmable memory circuit comprising:
   a decoder responsive to address input signals for addressing the memory;
   an access line for the memory;
   transfer gate means connected between said decoder and said access line and responsive to a read/write switch signal for connecting or disconnecting the output of the decoder to said access line; and
   selective voltage supply circuit means connected to said access line and responsive to selection of said access line to provide different voltage levels on said access line in accordance with a read/write mode, said selective voltage supply circuit means including a first terminal, a switching means coupled between said first terminal and said access line, a voltage selecting means responsive to said read/write switch signal for selectively applying one of a read power supply voltage or a write power supply voltage to said first terminal, and control means responsive to a level of said access line for selectively enabling said switching means when said access line is selected.

2. The programmable memory circuit according to claim 1 wherein said decoder includes a main decoder in the form of a NAND gate and a sub-decoder in the form of a complementary logic circuit, and said transfer gate includes a depletion type semiconductor element.

3. The programmable memory circuit according to claim 1 wherein the output of said decoder selectively assumes a level of the read power supply voltage or a ground level, and said transfer gate means connects the output of said decoder to said access line in the read mode and disconnects the output of said decoder from said access line in the write mode.

4. The programmable memory circuit according to claim 1 wherein said voltage selecting means includes a second voltage terminal for receiving the read power supply voltage, a third terminal for receiving the write power supply voltage, a first switch coupled between said second terminal and said first terminal, a second switch coupled between said third terminal and said first terminal, and means responsive to said read/write switch signal for selectively enabling said first and second switches.

* * * * *

UNITED STATES PATENT AND TRADEMARK OFFICE
CERTIFICATE OF CORRECTION

PATENT NO. : 4,583,205

DATED : April 15, 1986

INVENTOR(S) : Takeshi WATANABE, Tokyo, Japan

It is certified that error appears in the above-identified patent and that said Letters Patent is hereby corrected as shown below:

Column 3, line 57, change "A3" to --$\overline{A3}$--.

Column 6, line 26, change "complementare" to --complementary--;

line 26, delete "two sub-";

line 27, delete "decoders associated with one main decoder is applied";

line 28, delete "with a set of address input signals A3, A3 and its com-";

line 28, delete "plementary".

Signed and Sealed this

Thirty-first Day of March, 1987

*Attest:*

DONALD J. QUIGG

*Attesting Officer*   *Commissioner of Patents and Trademarks*